United States Patent [19]
Hamada et al.

[11] Patent Number: 5,523,574
[45] Date of Patent: Jun. 4, 1996

[54] EXPOSURE APPARATUS

[75] Inventors: Tomohide Hamada; Hiroshi Shirasu, both of Yokohama, Japan

[73] Assignee: Nikon Corporation, Tokyo, Japan

[21] Appl. No.: 448,659

[22] Filed: May 24, 1995

[30] Foreign Application Priority Data

May 31, 1994 [JP] Japan .................. 6-140787

[51] Int. Cl.$^6$ .................................................. G21K 5/00
[52] U.S. Cl. ............................ 250/492.2; 355/53
[58] Field of Search .......................... 250/492.2, 491.1; 378/34, 35, 205, 206, 208; 355/53

[56] References Cited

U.S. PATENT DOCUMENTS 4,924,257  5/1990  Jain ........................................ 250/492.2

Primary Examiner—Jack I. Berman
Assistant Examiner—Kiet T. Nguyen
Attorney, Agent, or Firm—Shapiro and Shapiro

[57] ABSTRACT

An exposure apparatus has an illumination system for illuminating a mask with a light beam, a projection optical system for projecting a mask pattern on a photosensitive substrate and a carriage for integrally holding the mask and the photosensitive substrate. The exposure apparatus further has a detection system for detecting a change in attitude of the carriage and a correction system for correcting a positional deviation between the mask and the photosensitive substrate on the basis of a detected result of the detection system.

11 Claims, 5 Drawing Sheets

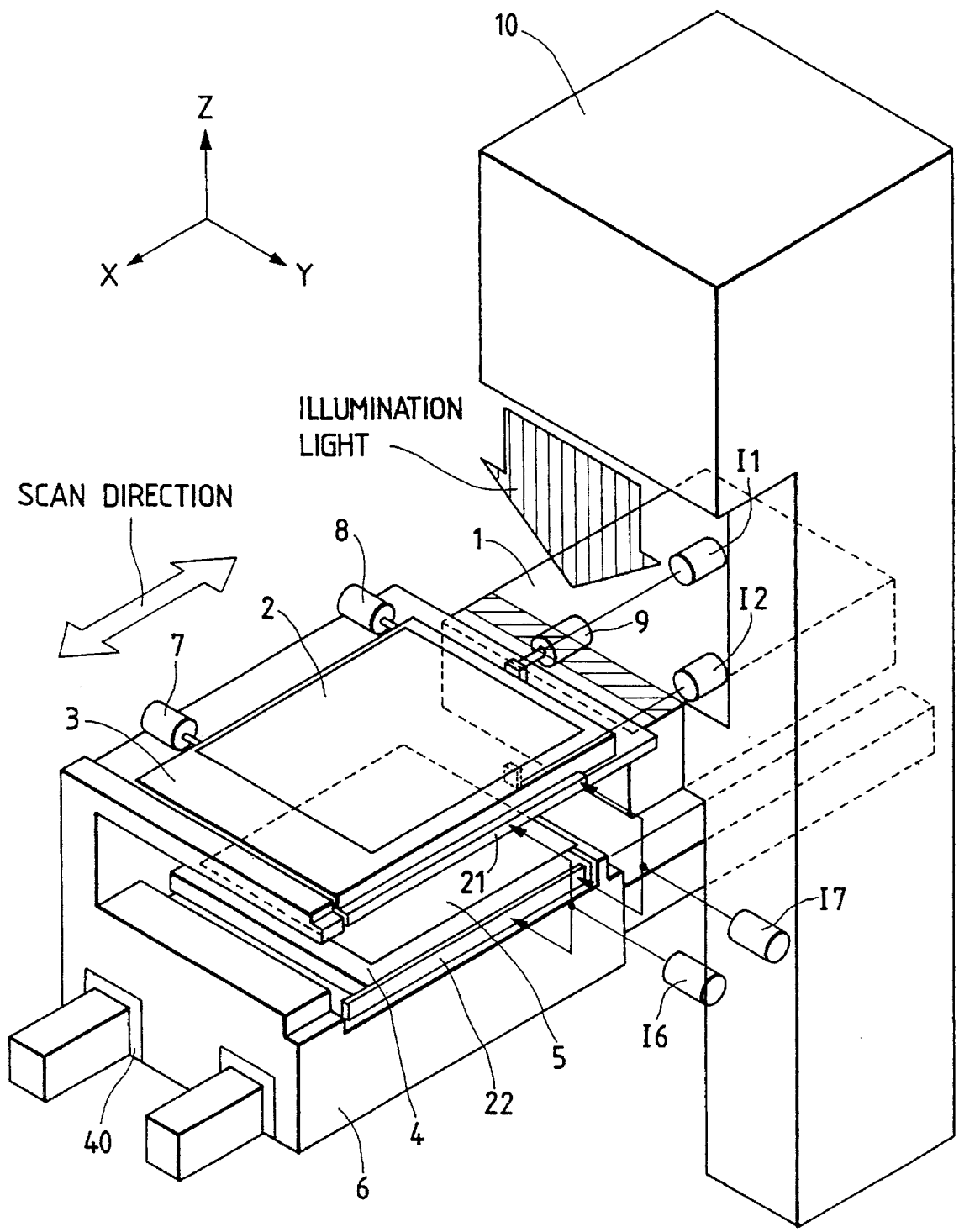

EXPOSURE APPARATUS

BACKGROUND OF THE INVENTION

1. Field of the Invention

The present invention relates generally to an exposure apparatus and, more particularly, to a scan type exposure apparatus, suitable for manufacturing a semiconductor device or a liquid crystal display device, for performing a scan exposure while integrally holding a mask and a substrate with a carriage.

2. Related Background Art

FIG. 3 is a view schematically illustrating a construction of a typical equi-powered unit magnification projection exposure apparatus.

Referring to FIG. 3, patterns formed on a mask (unillustrated) placed on a mask stage 32 are illuminated uniformly with light beams radiated from an illumination optical system 31 and then projection-exposed on a photosensitive substrate not shown placed on a substrate stage 35 through a unit magnification (X1) projection optical system 33. The mask stage 32 and the substrate stage 35 are integrally held by a carriage 36 and scanned in an X-direction in FIG. 3 when effecting the projection exposure.

Note that the mask stage 32 is driven in X- and Y-axis directions and in a direction of rotation about a Z-axis by X-directional actuators 37, 38 and a Y-direction actuator (unillustrated) as well. Further, the illumination optical system 31 and the projection optical system 33 are held on a base board 34 fixed onto a fixed board 30.

When performing the scan-exposure, to start with, the mask and substrate are aligned with each other. That is, an alignment microscope detects an alignment mark formed on the mask and an alignment mark formed on the substrate, and the above actuators (37, 38, etc.) are driven to correct a positional deviation between the two marks.

After effecting the alignment, the carriage 36 is driven along a drive guide surface in one direction (scan direction) on the fixed board 30 by an unillustrated drive mechanism. That is, an exposure accuracy is dominated by a drive guide accuracy. Further, if there arises a necessity for slightly changing an exposure magnification by an extension and contraction of the substrate (normally, on the order of 10 ppm), oscillation drive control of the carriage 36 is executed.

On this occasion, the carriage 36 is driven while moving at least one of the mask and the substrate in the optical-axis direction (so-called focusing) or tilting it (so-called auto leveling) in accordance with a position of the carriage so that there are fixed a distance between the mask and the substrate and a relative tilt therebetween in a projection area of the projection optical system 33. Namely, the carriage 36 is driven and guided in consideration of influences by variations both in flatness of the surface of the substrate and in thickness thereof.

In the above-described conventional unit magnification projection exposure apparatus, the transfer accuracy of the mask pattern depends on the drive-guide accuracy of the carriage for integrally supporting the mask and the substrate, That is, if an attitude of the carriage changes during the scan exposure, disadvantages are caused wherein there is produced a relative positional deviation between the mask and the substrate with respect to the optical axis or projection field of the projection optical system, and the mask transfer accuracy is deteriorated.

SUMMARY OF THE INVENTION

It is a primary object of the present invention, which was devised in view of the problems given above, to provide an exposure apparatus capable of ensuring a highly stable transfer accuracy by correcting a relative positional deviation between a mask and a substrate.

To accomplish the above object, according to one aspect of the present invention, an exposure apparatus comprises an illumination system for illuminating a mask with a light beam, a projection optical system for projecting a mask pattern on a photosensitive substrate and a carriage for integrally holding the mask and the photosensitive substrate. The exposure apparatus further comprises a detection system for detecting a change in attitude of the carriage and a correction system for correcting a positional deviation between the mask and the photosensitive substrate on the basis of a detected result of the detection system.

Based on the construction given above, the exposure apparatus is capable of correcting a relative positional deviation between the mask and the photosensitive substrate, which is derived from the attitude change of the carriage, i.e., rolling and pitching of the carriage as well as of ensuring a stable and high exposure accuracy (transfer accuracy).

BRIEF DESCRIPTION OF THE DRAWINGS

Other objects and advantages of the present invention will become apparent during the following discussion in conjunction with the accompanying drawings, in which:

FIG. 2A is a perspective view illustrating a construction of the equi-powered projection exposure apparatus in a second embodiment of the present invention;

DESCRIPTION OF THE PREFERRED EMBODIMENTS

Embodiments of the present invention will hereinafter be described with reference to the accompanying drawings.

Figure 1A:
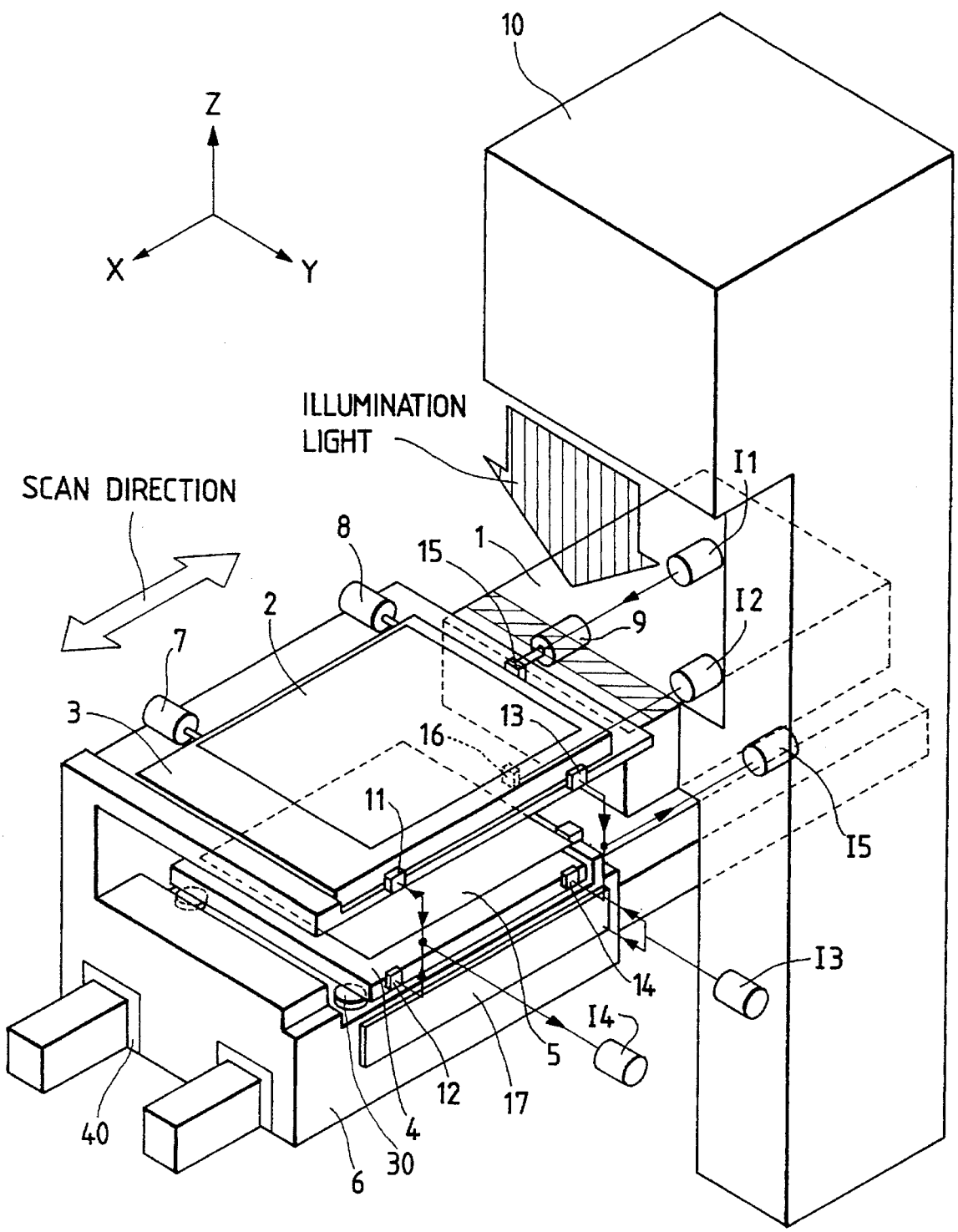
FIG. 1A is a perspective view illustrating a construction of a unit magnification (X1) projection exposure apparatus in a first embodiment of the present invention.

FIG. 1A is a perspective view illustrating a construction of a unit magnification (X1) projection exposure apparatus in a first embodiment of the present invention.

Referring to FIG. 1A, an X-axis indicates a direction in which a mask 2 formed with predetermined patterns and a plate 5 serving as a photosensitive substrate are scanned, a Y-axis indicates a direction orthogonal to the X-axis within a plane of the mask 2, and a Z-axis indicates a normal direction (optical-axis direction of a projection optical system 1) of the mask 2.

The unit magnification projection exposure apparatus of FIG. 1A includes a light source such as, e.g., an ultra-high pressure mercury lamp and an illumination optical system (unillustrated), constructed of a fly's eye lens, etc., for uniformly illuminating an area, taking a predetermined shape, of the mask 2 with the light. The mask 2 is placed on a mask stage 3 so that the mask 2 is substantially parallel to an XY plane. The projection optical system 1 projecting erect image of the mask pattern onto the plate 5, is disposed downwardly of the mask 2 in the Figure. The plate 5 such as a glass substrate or the like is placed on a plate stage 4 so that the plate 5 is substantially parallel to the XY plane more downwardly of the projection optical system 1 in the Figure.

The illumination optical system and the projection optical system 1 are held on a base board 10. On the other hand, the mask stage 3 and the plate stage 4 are integrally supported on a common carriage 6.

The mask stage 3 is, as shown in the Figure, capable of making micromotions in a rotating direction about the Z-axis as well as in X- and Y-directions by use of Y-directional micromotion actuators 7, 8 and an X-directional micromotion actuator 9. That is, the mask stage 3 is supported on the carriage 6 through the micromotion actuators 7, 8 and 9 provided on the carriage 6.

On the other hand, the plate stage 4 is so constructed as to be properly movable in the Z-direction in order to correct influences by an unevenness in thickness, a tilt and a waviness of the plate 5, in other words, the plate stage 4 being movable so that each exposure area of the plate 5 during a scan exposure substantially aligns with a pattern image forming surface of the mask 2 through the projection optical system 1. The plate stage 4 is also so constructed as to be tiltable about the X- and Y-axes. That is, the plate stage 4 is supported on the carriage 6 through a plurality of actuators 30 in FIG. 1A only one actuator shown capable of focusing (causing a movement in the Z-direction) and leveling (causing the tilt about the X- and Y-axes).

Thus, the mask stage 3 mounted with the mask 2 and the plate stage 4 mounted with the plate 5 are integrally held by the common carriage 6. In other words, the mask 2 and the plate 5 are mechanically joined to each other through the respective stage 3, 4 and the carriage 6 as well. Accordingly, the carriage 6 is scanned in the X-direction, thereby making the mask 2 and the plate 5 possible of undergoing the scan exposure in synchronism through the projection optical system 1. More specifically, with the one-directional (X-directional) scanning, the entire pattern areas formed on the mask 2 are projection-exposed (transferred) onto the plate 5. In this embodiment, the projection optical system 1 has a long image field range (like a slit shape) elongated in Y-direction to cover a size of the entire mask pattern area in Y-direction.

Note that the carriage 6 includes a driving unit 40 (for example linear motor) having a long stroke along the scan direction (X-direction) to perform the one-dimensional (one-directional) scan-exposure.

In the apparatus of FIG. 1A, a differential type of laser interferometers I4 (only an optical path is shown) and I5 are disposed in positions (X-directional positions are the same) corresponding to Y-directional micromotion actuators 7 and 8, respectively. The laser interferometer I4 splits a laser beam emitted from the light source fixed to the carriage 6 into two laser beams and guides each laser beam to a reflex mirror 12 so fixed to the plate stage 4 as to be perpendicular to the Y-axis as well as to a reflex mirror 11 so fixed to the mask stage 3 as to be perpendicular to the Y-axis. Then, the interferometer I4 synthesizes the laser beams reflected by the reflex mirrors 11, 12 and receives the interference light beams, thereby detecting a relative positional deviation in a non-scan direction (Y-direction) between the mask 2 and the plate 5 in the position corresponding to the Y-directional micromotion actuator 7. The interferometer I4 includes a beam splitter mounted on the carriage 6 to synthesize two reflected laser beams and to make interfered beam.

On the other hand, the laser interferometer I5 also splits the laser beam emitted from the light source fixed to the carriage 6 into two laser beams and guides each laser beam to a reflex mirror 14 so fixed to the plate stage 4 as to be perpendicular to the Y-axis as well as to a reflex mirror 13 so fixed to the mask stage 3 as to be perpendicular to the Y-axis. Then, the interferometer I5 synthesizes the laser beams reflected by the reflex mirrors 13, 14 and receives the interference light beams made by a beam splitter mounted on the carriage 6, thereby detecting a relative positional deviation in the Y-direction between the mask 2 and the plate 5 in the position corresponding to the Y-directional micromotion actuator 8.

Thus, the laser interferometers I4, I5 are capable of detecting the Y-directional relative positional deviations between the mask 2 and the plate 5 in the two positions spaced away from each other in the X-direction. Further, it is possible to detect a relative positional deviation along the normal line (the rotating direction about the Z-axis) between the mask 2 and the plate 5 on the basis of a difference between the detected results given by the laser interferometers I4, I5. Herein, the laser interferometers I4, I5 make use of the light beams emitted from the light sources fixed to the carriage 6, and, therefore, the Y-directional relative positional deviations detected by the laser interferometers I4, I5 do not contain an influence by a change in terms of attitude (an attitude change in a rolling direction which will be mentioned later) of the carriage 6.

Note that the optical paths of the deflecting laser beams are desirably constructed to be equalized so that the laser beams deflected respectively to the mask stage 3 and the plate stage 4 are hard to undergo influences by variations both in atmospheric pressure and in temperature.

As explained above, the mask 2 is supported on the mask stage 3 mounted on the carriage 6. Then, the mask stage 3 can be located in arbitrary positions in the X- and Y-directions as well as in the rotating direction about the Z-axis by use of the Y-directional micromotion actuators 7, 8 and the X-directional micromotion actuator 9.

Accordingly, the Y-directional relative positional deviations and the about-Z-axis rotating directional relative positional deviation, which have been detected by the laser interferometers I4, I5, can be corrected by the operations of the Y-directional micromotion actuators 7, 8.

Further, a laser interferometer I1 is disposed on the side of the mask stage 3, while a laser interferometer I2 is disposed on the side of the plate stage 4 in positions (to which Y-directional coordinates correspond) corresponding to the X-directional micromotion actuator 9.

The laser interferometer I1 is a length measuring type interferometer. The laser interferometer I1 guides laser beams emitted from a light source fixed to a fixing system such as, e.g., a base board 10 and a projection optical system 1 to a reflex mirror 15 so fixed to the mask stage 3 as to be perpendicular to the X-axis and to a fixed mirror (unillustrated) fixed to the base board 10. Then, the interferometer I1 makes the light beam from the reflex mirror 15 interfere with the reflected light beam from the fixed mirror (unillustrated) fixed to the base board 10 and receives the interference light beam, thereby detecting an X-directional position of the mask 2 on the basis of a variation in measurement quantity of this interferometer.

On the other hand, the laser interferometer I2 is also a length measuring type of interferometer. The laser interferometer I2 guides laser beams emitted from a light source fixed to the fixing system such as the base board 10 and the projection optical system 1 to a reflex mirror 16 so fixed to the plate stage 4 as to be perpendicular to the X-axis and to the same fixed mirror (unillustrated) as the above-mentioned that is fixed to the base board 10. Then, the interferometer I2 makes the light beam from the reflex mirror 16 interfere with the reflected light beam from the fixed mirror (unillustrated) fixed to the base board 10 and receives the interference light beam, thereby detecting an X-directional position of the plate 5 on the basis of a variation in measurement quantity of this interferometer.

Further, it is possible to detect the X-directional relative positional deviation between the mask 2 and the plate 5 on the basis of the difference between the detected results given by the laser interferometers I1, I2. AS discussed above, both of the laser interferometers I1, I2 make use of the light sources fixed to the fixing system and are therefore capable of detecting the scan-directional (X-directional) relative positional deviations between the mask 2 and the plate 5, including an attitude change of the carriage 6 in a pitching direction (rotating direction about the Y-axis), i.e., a pitching quantity of the carriage 6.

Note an output of the laser interferometer I2 disposed on the side of the plate stage 4 is fed back to a carriage drive controller for performing scan-control of the driving unit 40. In this way, the carriage drive controller is capable of controlling a velocity of the plate 5 so that exposure quantities over the entire areas of the plate 5 are uniformized during the scan-exposure, in other words, the velocity being controlled so that the plate 5 is scanned at a fixed velocity with respect to the projection optical system 1.

The apparatus further includes a laser interferometer I3 for detecting a change in attitude of the carriage 6 in the rolling direction (rotating direction about the X-axis). The laser interferometer I3 is a differential type interferometer. The laser interferometer I3 splits the laser beam emitted from the light source fixed to the fixing system such as the base board 10 and the projection optical system 1 into the two laser beams and guides the respective laser beams to two points spaced away in the optical-axis (Z-axis) direction on a reflex mirror 17 so fixed to the carriage 6 as to be perpendicular to the Y-axis. Then, the interferometer I3 synthesizes the laser beams reflected by the reflex mirror 17 and receives the interference light beams, thereby detecting an about-X-axis rotational quantity, i.e., a rolling quantity of the carriage 6 as a whole. Note that the laser interferometer I3 makes use of the laser beams emitted from the light source fixed to the fixing system, and, hence, the reflex mirror 17 extends long along the X-direction over scanning stroke and has a predetermined width in Z-direction.

With the rolling of the carriage 6, a Y-directional relative positional deviation is caused between the mask 2 and the plate 5. This Y-directional relative positional deviation can be arithmetically obtained from the detected rolling quantity. The thus obtained Y-directional relative positional deviation is, as in the case of the Y-directional relative positional deviations detected by the above interferometers I4, I5, correctable by properly driving the Y-directional micromotion actuators 7, 8.

Figure 1B:
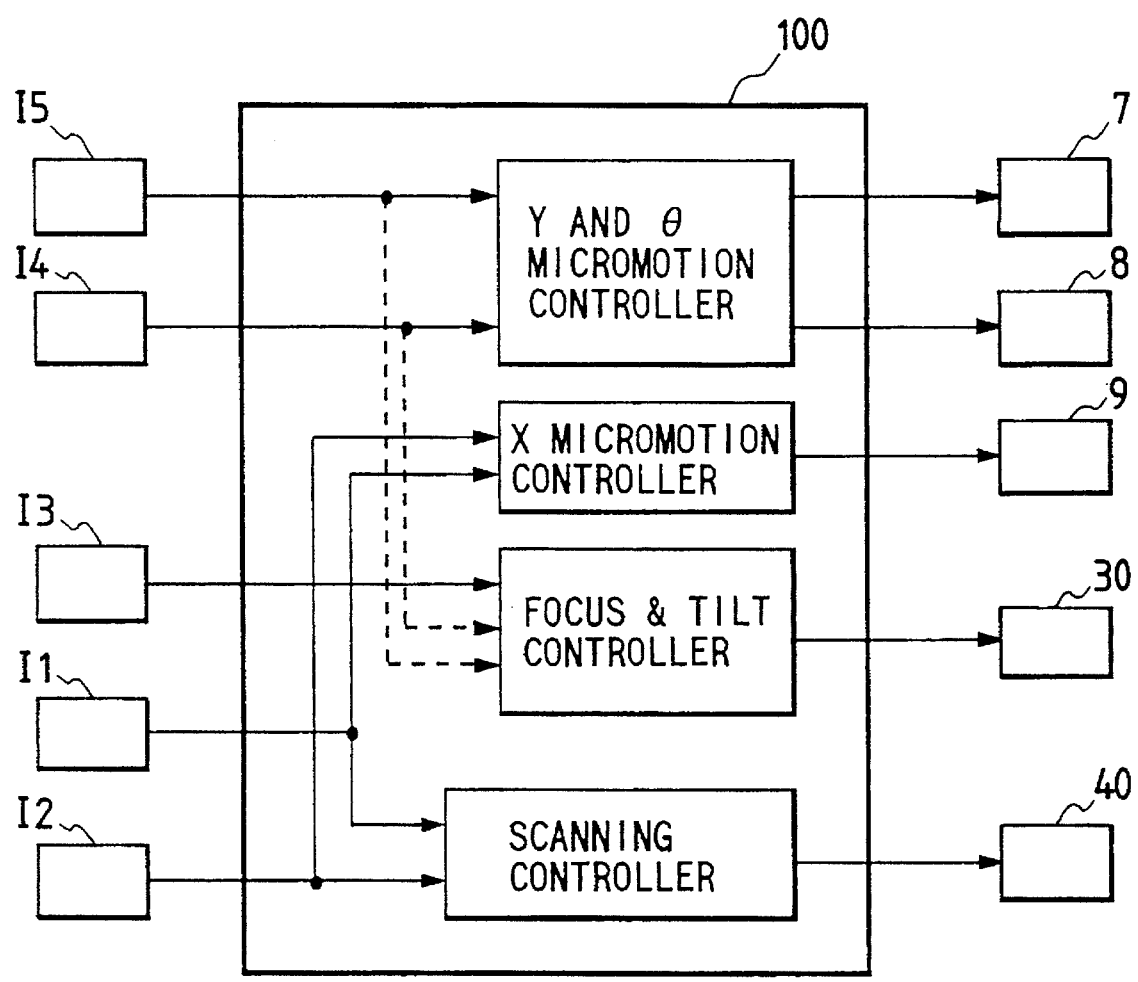
FIG. 1B is a block diagram showing a structure of a control system suitable for driving each actuator in the first embodiment.

FIG. 1B is a block diagram of a preferable control system 100 for the first embodiment. Measurement values from interferometers I1 and I2 are transmitted to a scanning controller (including an operation circuit, position and speed servo circuits and the like) and used to control a drive unit 40 for scan-movement of the carriage 6. Simultaneously therewith, measurement values from the interferometers I1 and I2 are transmitted to an X micromotion controller (including an operation circuit, a servo circuit and the like) and used to effect drive-control of the actuator 9 of the mask stage 3.

Further, measurement values from interferometers I4 and I5 are transmitted to Y and 8 micromotion controller (including an operation circuit, a servo circuit and the like) and used to effect drive-control of the actuators 7 and 8 of the mask stage 3. As the case may be, measurement values from interferometers I4 and I5 are transmitted to Focus & Tilt controller (including an operation circuit, a servo circuit and the like) also and used to drive-control a plurality of actuators 30.

The Focus & Tilt controller mainly drive-controls the actuators 30 in response to measurement values from the interferometer I3 and particularly has a function effecting an operation with taking account of not only measurement values from the interferometer I3 but also measurement values from interferometers I4 and I5 with respect to an amount of tilt in non-scan direction (Y direction) of the photosensitive substrate.

FIG. 2A is a perspective view illustrating a construction of the equi-powered projection exposure apparatus in a second embodiment of the present invention.

The apparatus in the second embodiment has the same construction as the apparatus in the first embodiment but has a fundamental difference in terms of such a point that the interferometers I3 through I5 of the apparatus in the first embodiment are replaced with interferometers I6 and I7. The second embodiment will hereinafter be discussed while paying attention to this differential point.

The apparatus of FIG. 2A includes differential type laser interferometers I6, I7 in two positions spaced away from each other at a predetermined distance in the X-direction. The laser interferometer I6 splits the laser beam emitted from the light source fixed to the fixing system such as the base board 10 and the projection optical system 1 into two laser beams. The laser interferometer I6 guides the laser beams to a reflex mirror 21 so fixed to the mask stage 3 as to be perpendicular to the Y-axis and to a reflex mirror 22 so fixed to the plate stage 4 as to be perpendicular to the Y-axis. Subsequently, the interferometer I6 synthesizes the laser beams reflected by the reflex mirrors 21, 22 and receives the interference light beams, thereby detecting a Y-directional relative positional deviation between the mask 2 and the plate 5.

On the other hand, the laser interferometer I7 also splits the laser beam emitted from the light source fixed to the fixing system such as the base board 10 and the projection optical system 1 into two laser beams and guides each laser beam to a reflex mirror 21 so fixed to the mask stage 3 as to be perpendicular to the Y-axis as well as to a reflex mirror 22 so fixed to the plate stage 4 as to be perpendicular to the Y-axis. Then, the interferometer I7 synthesizes the laser beams reflected by the reflex mirrors 21, 22 and receives the interference light beams, thereby detecting a Y-directional relative positional deviation between the mask 2 and the plate 5.

Thus, the laser interferometers I6, I7 are capable of detecting the Y-directional relative positional deviations between the mask 2 and the plate 5 in the two positions spaced away from each other in the X-direction. Further, it is possible to detect an about-Z-axis rotating directional relative positional deviation between the mask and the plate 5 on the basis of a difference between the detected results given by the laser interferometers I6, I7. Herein, the laser interferometers I6, I7 make use of the light beams emitted from the light sources fixed to the fixing system, and, therefore, the Y-directional relative positional deviations detected by the laser interferometers I6, I7 contain a Y-directional relative positional deviation based on the attitude change of the carriage 6 in the rolling direction.

Figure 2B:
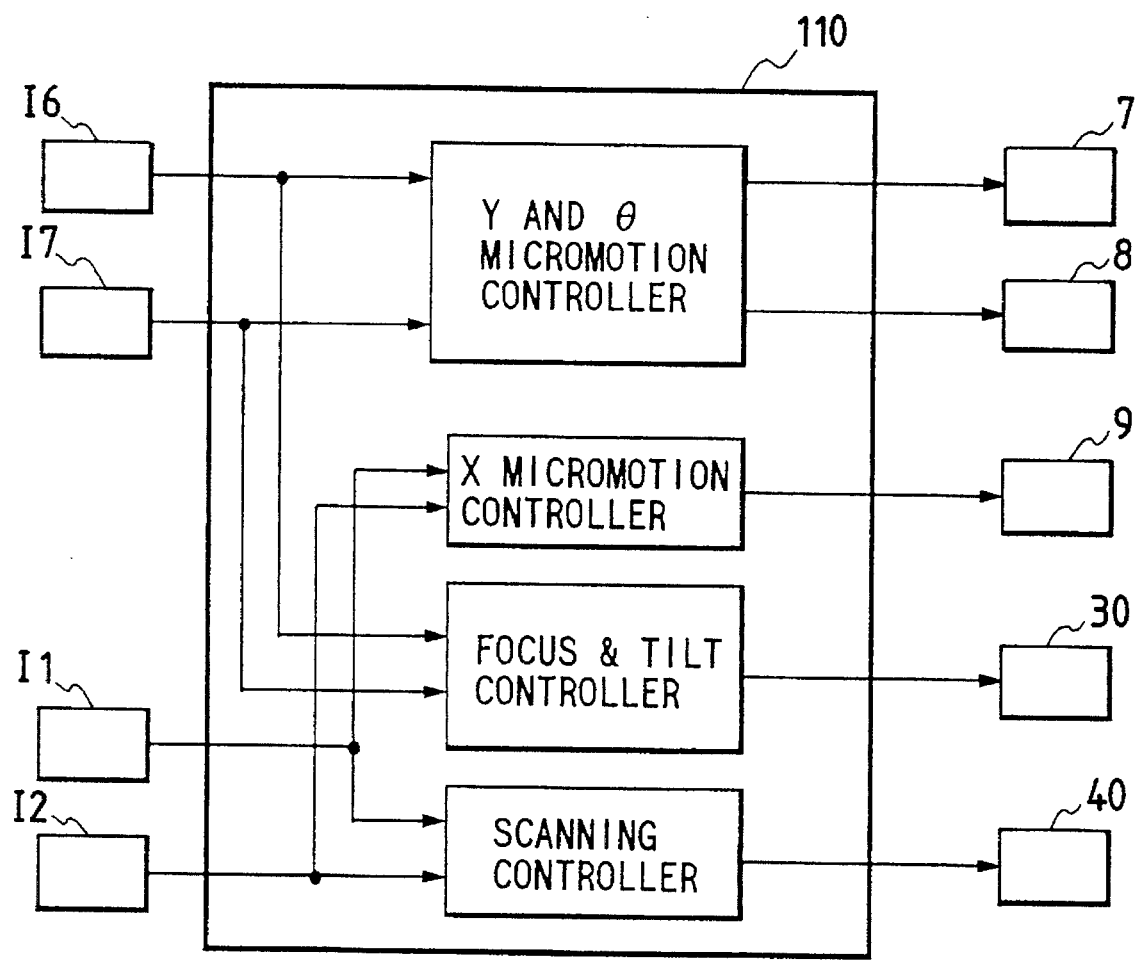
FIG. 2B is a block diagram showing a structure of a control system suitable for driving each actuator in the second embodiment.
Figure 3:
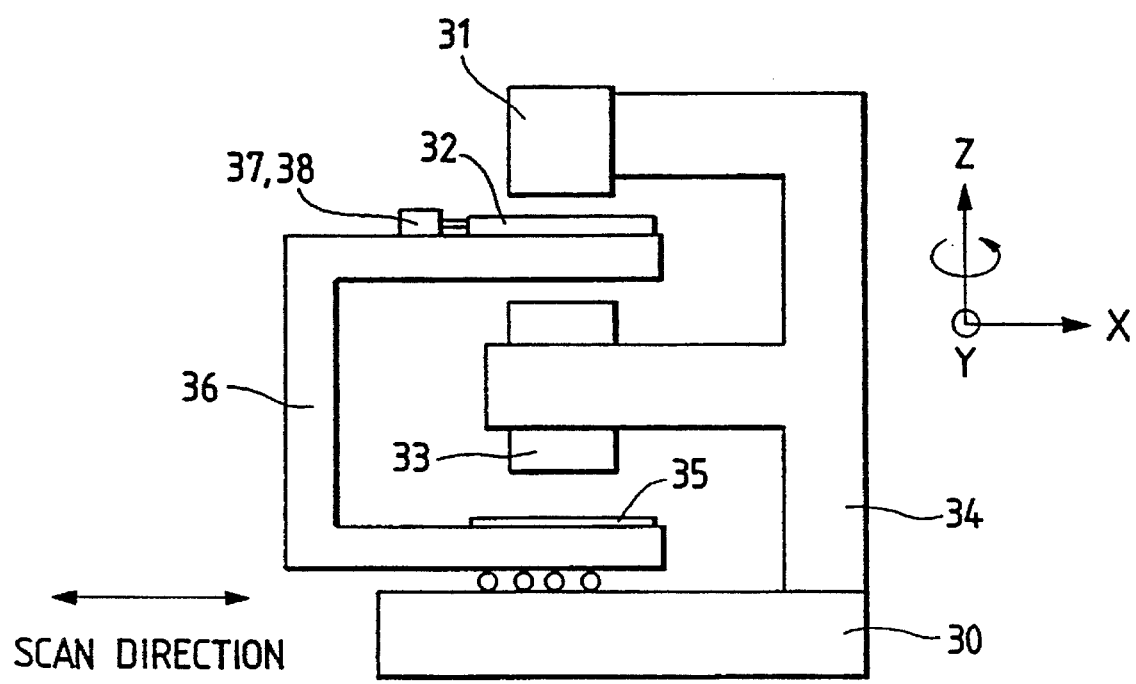
FIG. 3 is a view showing a construction of a conventional equi-powered projection exposure apparatus.

FIG. 2B is a block diagram of a preferable control system 110 for the second embodiment. Measurement values from interferometers I6 and I7 are transmitted to Y and θ micromotion controller, which drive-control the actuators 7 and 8 so that fine positional deviations in Y direction and θ direction (relation) of the mask pattern image on photosensitive substrate which deviation is caused in accordance with change in attitude of the carriage 6, as in the case of the first embodiment, may be corrected.

Simultaneously therewith, those measurement values are also transmitted to Focus & Tilt controller which is similar to that of the first embodiment, and the thus transmitted measurement values are used to drive-control the actuator 30 for correcting tilt deviation and focus deviation between pattern projection plane and photosensitive substrate caused according to change in attitude of the carriage 6.

Measurement values from interferometers I1 and I2 are transmitted to a scanning controller and an X micromotion controller, as in the case of the control system of the first embodiment, and used to control, respectively, drive unit 40 for scan-movement of the carriage 6 and X micromotion controller 9 of the mask stage 3.

As explained above, the laser interferometers I6, I7 make use of the light beams emitted from the light sources fixed to the fixing system, and hence the reflex mirrors 21, 22 need to extend longer than the mask 2 and the plate 5 in the X-direction. The first embodiment, however, requires totally five interferometers, but the total number of interferometers can be reduced down to four (I1, I2, I6, I7) in the second embodiment.

Further, all the interferometers are structured such that the light beams emerge from the fixing system and fall on the fixing system, and, therefore, an interference receiver is not required to be installed in the movable unit. This eliminates such a possibility that the movable unit moves while trailing a cable of the interferometer's receiver and therefore facilitates the construction. In addition, it follows that this restrains a disturbance transmitted to the movable unit through the cable of the interferometer's receiver, and the controllability can be thereby improved.

As discussed above, in accordance with the above second embodiment, there is no necessity for placing the interferometers on the mask- and plate-sides, so that the number of axes of the interferometers is reduced. The measurement can be therefore conducted at low costs at a high accuracy with a compact structure. Further, the correction control of the relative positional deviation does not entail obtaining a difference between the respective interferometers in the control system, and, hence, the construction of the control system is facilitated.

Note that the rotation of the carriage 6 about the Z-axis, i.e., yawing and displacements in X-, Y- and Z-directions are out of question in the above two embodiments. It is because the exposure image is not shifted, and the detection and the control are not needed on account of the projection optical system 1 being classified as a unit magnification erect imaging system.

Moreover, the mask stage 3 is equipped with the actuator mechanism in the each of two embodiments discussed above, but the plate stage 4 may be equipped with the actuator mechanism.

Furthermore, the two Y-directional differential actuators and one X-directional differential actuator are provided in the both embodiments discussed above, but one Y-directional differential actuator and two X-directional differential actuator may be provided.

Further, there are provided the two length measuring type interferometers I1, I2 in the X-direction in order to separately detect the X-directional position of each of the mask and the plate in the both embodiments discussed above. There may be, however, provided the differential type interferometer for detecting the relative positional deviation between the mask and the plate and also the length measuring type interferometer for detecting the X-directional position of the mask or the plate. In this case also, an inexpensive length measuring device such as a linear encoder, etc., may be employed for controlling the velocity of the carriage in place of the length measuring type interferometer.

Note that the above-discussed two embodiments take the construction (lateral type) in which the carriage 6 horizontally holds each of the mask 2 and the plate 5 but may take such a construction (vertical type) that the carriage 6 vertically holds each of the mask 2 and the plate 5. In this case, the optical axis (or principal lay of the pattern imaging light flux) of the projection optical system 1 is set in the horizontal direction.

According to the both embodiments given above, it is possible to detect and correct, as an entire quantity, the relative positional deviation between the mask and the photosensitive substrate that is attributed to the attitude change such as rolling and pitching of the carriage and also the relative positional deviation between the mask and the photosensitive substrate that is produced due to a leveling drive of the photosensitive substrate and an autofocus drive. Accordingly, the positional relationship between the mask and the photosensitive substrate with respect to the projection optical system is controlled to keep it constant during the movement of the carriage without depending on a guide accuracy (kinetic performance) of the mechanical system. Therefore, a stable high exposure accuracy (transfer accuracy) can be ensured.

Further, since the system is intended to correct the relative positional deviation while monitoring the relative positional deviation, the relative positional deviation corresponding to each condition can be corrected even if there exist a change with a passage of time in the apparatus and a difference in terms of using environment. The performance and the stability of the apparatus are thereby enhanced.

It is apparent that, in this invention, a wide range of different working modes can be formed based on the invention without deviating from the spirit and scope of the invention. This invention is not restricted by its specific working modes except being limited by the appended claims.

What is claimed is:

1. An exposure apparatus comprising:

an illumination system for illuminating a mask with a light beam;

a projection optical system for projecting a mask pattern on a photosensitive substrate;

a carriage for integrally holding said mask and said photosensitive substrate, said carriage being movable in a direction orthogonal to an optical axis of said projection optical system with respect to said projection optical system;

a detection system for detecting a change in attitude of said carriage; and a correction system for correcting a positional deviation between said mask and said photosensitive substrate on the basis of a detected result given by said detection system, the deviation being derived from the attitude change of said carriage.

2. An exposure apparatus according to claim 1, wherein said correction system has a moving system for relatively moving a first stage and a second stage.

3. An exposure apparatus according to claim 1, wherein the attitude change of said carriage is attributed to pitching relative to a predetermined direction.

4. An exposure apparatus according to claim 1, wherein the attitude change of said carriage is attributed to rolling relative to a predetermined direction.

5. An exposure apparatus according to claim 1, wherein said detection system detects the attitude change of said carriage during a movement of said carriage.

6. An exposure apparatus comprising:

a carriage for integrally holding a mask and a photosensitive substrate;

a detector for detecting a change in attitude of said carriage; and a correction system for correcting a positional deviation between said mask and said photosensitive substrate due to the attitude change of said carriage on the basis of a detected result given by said detector.

7. An exposure apparatus according to claim 6, wherein said correction system has a moving system for relatively moving said mask and said photosensitive substrate.

8. An exposure apparatus comprising:

an illumination system for illuminating a pattern on a mask with light beams;

a projection optical system for projecting the mask pattern on a photosensitive substrate;

a carriage for integrally holding a mask stage on which said mask is placed and a substrate stage on which said photosensitive substrate is placed and moving said mask stage and said substrate stage in a predetermined direction perpendicular to an optical axis of said projection optical system;

a first detector for detecting a position of said mask stage with respect to the predetermined direction;

a second detector for detecting a position of said substrate stage with respect to the predetermined direction; and a correction system for correcting a relative positional deviation between said mask and said photosensitive substrate with respect to the predetermined direction on the basis of detected results given by said detectors.

9. An exposure apparatus according to claim 8, wherein said first detector and said second detector perform a positional detection during a movement of said carriage.

10. An exposure apparatus according to claim 8, further comprising:

a third detector for detecting a relative positional deviation between said mask stage and said photosensitive substrate stage with respect to the predetermined direction and a direction orthogonal to the optical axis of said projection optical system;

a fourth detector for detecting the relative positional deviation between said mask stage and said photosensitive substrate stage with respect to the predetermined direction and the direction orthogonal to the optical axis of said projection optical system in a position spaced away at a predetermined distance from said third detector; and a second correction system for correcting the relative positional deviation between said mask and said photosensitive substrate with respect to a rotating direction about the optical axis on the basis of a difference between detected results of said third detector and said fourth detector.

11. An exposure apparatus according to claim 10, wherein said first detector, said second detector, said third detector and said fourth detector perform the detecting operations during the movement of said carriage.

\* \* \* \* \*